US007230961B2

(12) United States Patent
Hofmeister et al.

(10) Patent No.: US 7,230,961 B2
(45) Date of Patent: Jun. 12, 2007

(54) TEMPERATURE AND JITTER COMPENSATION CONTROLLER CIRCUIT AND METHOD FOR FIBER OPTICS DEVICE

(75) Inventors: Ruldolf J. Hofmeister, Sunnyvale, CA (US); Samantha R. Bench, Whitefish, MT (US); Dmitri Bannikov, Mountain View, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/054,999

(22) Filed: Feb. 10, 2005

(65) Prior Publication Data

US 2005/0201431 A1  Sep. 15, 2005

Related U.S. Application Data

(62) Division of application No. 10/695,342, filed on Oct. 28, 2003.

(60) Provisional application No. 60/425,001, filed on Nov. 8, 2002.

(51) Int. Cl.
*H01S 3/13* (2006.01)
(52) U.S. Cl. .............................. 372/29.015; 372/29.02; 372/38.02
(58) Field of Classification Search ........... 372/29.015, 372/29.012, 29.02, 38.02
See application file for complete search history.

(56) References Cited

U.S. PATENT DOCUMENTS

| 4,359,553 A | 11/1982 | Edwards |
| 4,378,451 A | 3/1983 | Edwards |
| 4,687,924 A | 8/1987 | Galvin et al. |
| 4,734,914 A | 3/1988 | Yoshikawa |

(Continued)

FOREIGN PATENT DOCUMENTS

EP  0580317 A1  1/1994

(Continued)

OTHER PUBLICATIONS

Yi Cai et al., "Jitter testing for gigabit serial communication transceivers," Jan.-Feb. 2002, IEEE Design and Test of Computers, vol. 19, Issue 1, pp. 66-74.

(Continued)

*Primary Examiner*—Dung (Michael) T. Nguyen
(74) *Attorney, Agent, or Firm*—Workman Nydegger

(57) ABSTRACT

An exemplary optoelectronic transceiver 100 incorporating features of the present invention is shown in FIGS. 2 and 3. The transceiver 100 contains a receiver circuit, a transmitter circuit, a power supply voltage 19 and ground connections 20. The receiver circuit of the transceiver includes a Receiver Optical Subassembly (ROSA) 102, which may contain a mechanical fiber receptacle as well as a photodiode and pre-amplifier (preamp) circuit. The ROSA 102 is in turn connected to a post-amplifier (postamp) integrated circuit 106, the function of which is to generate a fixed output swing digital signal which is connected to outside circuitry via the RX+ and RX− pins 17. The postamp circuit 106 also often provides a digital output signal known as Signal Detect or Loss of Signal indicating the presence or absence of suitably strong optical input. The postamp circuit 106 does not necessarily have to be used to generate the Signal Detect or Loss of signal. In alternative embodiments, the postamp circuit 106 could be replaced with a CDR ("Clock Data Recovery") or a demux chip, which embodiments are not shown.

20 Claims, 7 Drawing Sheets

U.S. PATENT DOCUMENTS

| | | | |
|---|---|---|---|
| 4,747,091 A | 5/1988 | Doi | |
| 4,809,286 A | 2/1989 | Kollanyi et al. | |
| 4,916,707 A | 4/1990 | Rosenkranz | |
| 4,932,038 A | 6/1990 | Windus | |
| 5,019,769 A * | 5/1991 | Levinson | 372/31 |
| 5,039,194 A | 8/1991 | Block et al. | |
| 5,041,491 A | 8/1991 | Turke et al. | |
| 5,268,949 A | 12/1993 | Watanabe et al. | |
| 5,287,375 A | 2/1994 | Fujimoto | |
| 5,334,826 A | 8/1994 | Sato et al. | |
| 5,383,208 A | 1/1995 | Queniat et al. | |
| 5,392,273 A | 2/1995 | Masaki et al. | |
| 5,396,059 A | 3/1995 | Yeates | |
| 5,448,629 A | 9/1995 | Bosch et al. | |
| 5,516,563 A | 5/1996 | Schumann et al. | |
| 5,557,437 A | 9/1996 | Sakai et al. | |
| 5,574,435 A | 11/1996 | Mochizuki | |
| 5,576,877 A | 11/1996 | Aulet et al. | |
| 5,594,748 A | 1/1997 | Jabr | |
| 5,604,758 A | 2/1997 | AuYeung et al. | |
| 5,673,282 A | 9/1997 | Wurst | |
| 5,748,672 A | 5/1998 | Smith et al. | |
| 5,761,216 A | 6/1998 | Sotome et al. | |
| 5,801,866 A | 9/1998 | Chan et al. | |
| 5,812,572 A | 9/1998 | King et al. | |
| 5,854,704 A | 12/1998 | Grandpierre | |
| 5,926,303 A | 7/1999 | Giebel et al. | |
| 5,953,690 A | 9/1999 | Lemon et al. | |
| 5,956,168 A | 9/1999 | Levinson et al. | |
| 5,966,395 A | 10/1999 | Ikeda | |
| 6,055,252 A | 4/2000 | Zhang | |
| 6,064,501 A | 5/2000 | Roberts et al. | |
| 6,157,022 A | 12/2000 | Meada et al. | |
| 6,160,647 A | 12/2000 | Gilliland et al. | |
| 6,175,434 B1 | 1/2001 | Feng | |
| 6,188,059 B1 | 2/2001 | Nishlyama et al. | |
| 6,198,558 B1 | 3/2001 | Graves et al. | |
| 6,205,505 B1 | 3/2001 | Jau et al. | |
| 6,222,660 B1 | 4/2001 | Traa | |
| 6,229,788 B1 | 5/2001 | Graves et al. | |
| 6,256,127 B1 | 7/2001 | Taylor | |
| 6,292,497 B1 | 9/2001 | Nakano | |
| 6,313,459 B1 | 11/2001 | Hoffe et al. | |
| 6,423,963 B1 | 7/2002 | Wu | |
| 6,473,224 B2 | 10/2002 | Dugan et al. | |
| 6,512,617 B1 | 1/2003 | Tanji et al. | |
| 6,519,255 B1 | 2/2003 | Graves | |
| 6,526,076 B2 | 2/2003 | Cham et al. | |
| 6,560,255 B1 | 5/2003 | O'Brien et al. | |
| 6,570,149 B2 | 5/2003 | Maruyama et al. | |
| 6,594,050 B2 | 7/2003 | Jannson et al. | |
| 6,631,146 B2 | 10/2003 | Pontis et al. | |
| 6,643,472 B1 | 11/2003 | Sakamoto et al. | |
| 6,661,836 B1 | 12/2003 | Dalal et al. | |
| 6,694,462 B1 | 2/2004 | Reis et al. | |
| 6,748,181 B2 | 6/2004 | Miki et al. | |
| 6,862,302 B2 | 3/2005 | Chieng et al. | |
| 6,937,949 B1 | 8/2005 | Fishman et al. | |
| 6,941,077 B2 | 9/2005 | Aronson et al. | |
| 6,952,531 B2 | 10/2005 | Aronson et al. | |
| 7,020,567 B2 | 3/2006 | Fishman et al. | |
| 7,058,310 B2 | 6/2006 | Aronson et al. | |
| 2001/0046242 A1 | 11/2001 | Kawakami et al. | |
| 2001/0046243 A1 | 11/2001 | Schie | |
| 2002/0021468 A1 | 2/2002 | Kato et al. | |
| 2002/0027688 A1 | 3/2002 | Stephenson | |
| 2002/0060824 A1 | 5/2002 | Liou et al. | |
| 2002/0097468 A1 | 7/2002 | Mecherle et al. | |
| 2002/0101641 A1* | 8/2002 | Kurchuk | 359/189 |
| 2002/0105982 A1 | 8/2002 | Chin et al. | |
| 2002/0105983 A1 | 8/2002 | Nomura | |
| 2002/0129379 A1 | 9/2002 | Levinson et al. | |
| 2002/0149821 A1 | 10/2002 | Aronson et al. | |
| 2002/0181519 A1 | 12/2002 | Vilhelmsson et al. | |
| 2002/0181894 A1 | 12/2002 | Gilliand et al. | |
| 2003/0053170 A1 | 3/2003 | Levinson et al. | |
| 2003/0110509 A1 | 6/2003 | Levinson et al. | |
| 2003/0113118 A1 | 6/2003 | Bartur | |
| 2003/0169790 A1 | 9/2003 | Chieng et al. | |
| 2003/0210917 A1 | 11/2003 | Stewart et al. | |
| 2004/0076113 A1 | 4/2004 | Aronson et al. | |
| 2004/0120720 A1 | 6/2004 | Chang et al. | |
| 2004/0153913 A1 | 8/2004 | Fishman et al. | |
| 2004/0202210 A1 | 10/2004 | Thornton | |
| 2004/0240886 A1 | 12/2004 | Aronson et al. | |
| 2004/0253003 A1* | 12/2004 | Farmer et al. | 398/214 |
| 2005/0031352 A1 | 2/2005 | Light et al. | |
| 2005/0058455 A1 | 3/2005 | Hosking et al. | |

FOREIGN PATENT DOCUMENTS

| | | |
|---|---|---|
| EP | 0745868 B1 | 4/2002 |
| EP | 0913896 B1 | 2/2004 |
| EP | 02704344 | 10/2004 |
| EP | 04017254 | 10/2004 |
| EP | 1471671 A2 | 12/2004 |
| JP | 58140175 A | 8/1983 |
| JP | 62124576 A | 6/1987 |
| JP | 62235975 A | 10/1987 |
| JP | 62281485 A | 12/1987 |
| JP | 402102589 A | 4/1990 |
| JP | 404023373 A | 1/1992 |
| JP | 06209209 A | 7/1994 |
| JP | 09162811 A | 6/1997 |
| WO | WO 98/00893 | 1/1998 |
| WO | WO 9800893 * | 1/1998 |
| WO | WO 98/00943 | 8/1998 |
| WO | PCT/US02/03226 | 5/2002 |
| WO | WO 02/063800 A1 | 8/2002 |
| WO | PCT/US04/11130 | 10/2004 |
| WO | WO/2004/098100 | 11/2004 |

OTHER PUBLICATIONS

Maeda, Noriyuki "Notification of Reason(s) for Refusal," Japanese Patent Application No. JP2002-563630, Nakamura, M. et al., Jul. 13, 2005.

Finisar Corp., "App. Note AN-2025: Using the Finisar GBIC I$^2$C Test Diagnostics Port," 1998.

Hausdorf, Reiner, "Mobile Transceiver Measurements with Radiocommunication Service Monitor CMS," News from Rohde & Schwarz, 127, IV, 1989, pp. 4-7.

Webopedia: The 7 Layers of the OSI Model [online] [retrieved Oct. 15, 2003]. Retrieved from Internet: URL: http://webopedia.internet.com/quick_ref/OSI_Layers.asp.

Webopedia.com: Public-Key Encryption [online] [retrieved Oct. 15, 2003]. Retrieved from Internet: URL: http://www.webopedia.com/TERM/p/public_key_cryptography.html.

Webopedia.com: MAC Address [online] [retrieved Oct. 15, 2003]. Retrieved from Internet: URL: http://www.webopedia.com/TERM/M/MAC_address.html.

Webopedia.com: I2C [online] [retrieved Nov. 11, 2003]. Retrieved from Internet: URL: http://www.webopedia.com/TERM/I/I2C.html.

Manchester Encoding [online] [retrieved Nov. 12, 2003]. Retrieved from Internet: URL: http://www.erg.abdn.ac.uk/users/gorry/course/phy-pages/man.html.

Documentation entitled "IR Receiver ASSP: T2525", copyright 2003 by Atmel Corporation.

Documentation entitled "IR Receiver for Data Communication: U2538B", copyright 2003 by Atmel Corporation.

Documentation entitled "Low-Voltage Highly Selective IR Receiver IC: T2527", copyright 2002 by Atmel Corporation.

Documentation entitled "Application Note: T2525/26/27", copyright 2003 by Atmel Corporation.

*LXT16706/16707 SerDes Chipset*, Intel Products, www.intel.com/design/network/products/optical/phys/1xt16706.htm, Apr. 19, 2002.

*LXT35401 XAUI-to-Quad 3.2G Transceiver*, Intel Products, www.intel.com/design/network/products/optical/phys/1xt35401.htm, Apr. 19, 2002.

Texas Instruments User's Guide, *TLK2201 Serdes EVM Kit Setup and Usage*, Mixed Signal DSP Solutions, Jul. 2000.

Texas Instruments User's Guide, *TLK1501 Serdes EVM Kit Setup and Usage*, Mixed Signal Products, Jun. 2000.

National Semiconductor DS92LV16 Design Guide, *Serializing Made Simple*, Feb. 2002.

Vaishali Semiconductor, *Fibre Channel Transceiver*, VN16117, MDSN-0002-02, Aug. 9, 2001.

Fairchild Semiconductor, Application Note 77, *CMOS, the Ideal Logic Family*, Jan. 1983.

Analog Target Specification, Annex 48B, Published by IEEE New York, May 2001, pp. 6-14.

* cited by examiner

TEMPERATURE AND JITTER COMPENSATION CONTROLLER CIRCUIT AND METHOD FOR FIBER OPTICS DEVICE

CROSS-REFERENCE TO RELATED APPLICATIONS

This application is a divisional, and claims the benefit, of U.S. patent application Ser. No. 10/695,342, entitled TEMPERATURE AND JITTER COMPENSATION CONTROLLER CIRCUIT AND METHOD FOR FIBER OPTICS DEVICE, filed Oct. 28, 2003, which, in turn, claim priority to, and benefit of, U.S. Provisional Patent Application No. 60/425,001, filed Nov. 8, 2002 and entitled "Temperature and Jitter Compensation Controller Circuit and Method for Fiber Optics Transceiver." All of the aforementioned applications are incorporated herein in their respective entireties by this reference.

BACKGROUND OF THE INVENTION

1. The Field of the Invention

The present invention relates generally to the field of optoelectronic devices. More particularly, the invention relates to systems and methods for controlling operating requirements of an optoelectronic device at various operating temperatures.

2. Related Technology

FIG. 1 shows a schematic representation of the essential features of a typical conventional fiber optic transceiver. The main circuit 1 contains at a minimum transmit and receive circuit paths and power 19 and ground connections 20. The receiver circuit typically consists of a Receiver Optical Subassembly (ROSA) 2 which contains a mechanical fiber receptacle and coupling optics as well as a photodiode and pre-amplifier (preamp) circuit. The ROSA is in turn connected to a post-amplifier (postamp) integrated circuit 4, the function of which is to generate a fixed output swing digital signal which is connected to outside circuitry via the RX+ and RX− pins 17. The postamp circuit 4 also often provides a digital output signal known as Signal Detect or Loss of Signal indicating the presence or absence of suitably strong optical input. The Signal Detect output is provided at output pin 18.

The transmit circuit will typically consist of a Transmitter Optical Subassembly (TOSA) 3 and a laser driver integrated circuit 5. The TOSA contains a mechanical fiber receptacle and coupling optics as well as a laser diode or LED. The laser driver circuit 5 will typically provide AC drive and DC bias current to the laser. The signal inputs for the AC driver are obtained from the TX+ and TX− pins 12. The laser driver circuitry typically will require individual factory setup of certain parameters such as the bias current (or output power) level and AC modulation drive to the laser. Typically this is accomplished by adjusting variable resistors or placing factory selected resistors 7, 9 (i.e., having factory selected resistance values). Additionally, temperature compensation of the bias current and modulation is often required. This function can be integrated in the laser driver integrated circuit or accomplished through the use of external temperature sensitive elements such as thermistors 6, 8.

In addition to the most basic functions described above, some optoelectronic device platform standards involve additional functionality. Examples of this are the TX disable 13 and TX fault 14 pins described in the Gigabit Interface Converter (GBIC) standard. In the GBIC standard (SFF-8053), the TX disable pin 13 allows the transmitter to be shut off by the host device, while the TX fault pin 14 is an indicator to the host device of some fault condition existing in the laser or associated laser driver circuit.

In addition, the GBIC standard includes a series of timing diagrams describing how these controls function and interact with each other to implement reset operations and other actions. Most of this functionality is aimed at preventing non-eyesafe emission levels when a fault condition exists in the laser circuit. These functions may be integrated into the laser driver circuit 5 itself or in an optional additional integrated circuit 11.

Finally, the GBIC standard for a Module Definition "4" GBIC also requires the EEPROM 10 to store standardized ID information that can be read out via a serial interface (defined as using the serial interface of the ATMEL AT24CO1A family of EEPROM products) consisting of a clock 15 and data line 16.

As an alternative to mechanical fiber receptacles, some conventional optoelectronic devices use fiber optic pigtails which are unconnectorized fibers.

Similar principles apply to fiber optic transmitters or receivers.

In order to maximize the performance and product life of an optoelectronic device, it is advantageous to configure the operating parameters of the optoelectronic device so as to perform temperature compensation and minimize jitter over a range of temperatures at a desired "extinction ratio" and optical power level.

One conventional approach uses a fixed set of temperature compensation parameters for all optoelectronic devices whose components and configurations are otherwise identical. Under high-volume manufacturing conditions, however, this approach is not desirable because the performance and behavior of the components comprising an optoelectronic device vary from component to component. Therefore, the use of universal temperature compensation parameters has different temperature and jitter compensation effects on different modules within a class of similarly configured optoelectronic devices, thereby not achieving the desired efficiency for individual optoelectronic devices.

Another approach uses a temperature controller to maintain a steady operating temperature for the optoelectronic device. This approach, however, is generally not feasible for pluggable optoelectronic devices because temperature controllers are typically too big to fit within such devices. For example, the dimensions for a pluggable optoelectronic device specified by GBIC standards are 1.2"×0.47"×2.6", and the dimensions for an optoelectronic device specified by SFP (Small Form Factor Pluggable) standards are 0.53"×0.37"×2.24". As pluggable optoelectronic devices become more and more compact, the use of a temperature controller in these devices is becoming less and less feasible. In addition, temperature controllers can be very expensive, thus increasing or rendering infeasible the cost of manufacturing the optoelectronic device.

Accordingly, what is needed is a control circuit for an optoelectronic device, and method to configure the circuit for each individual device so as to minimize jitter and improve the temperature performance for each individual optoelectronic device.

SUMMARY OF AN EMBODIMENT OF THE INVENTION

The present invention provides systems and methods for implementing a controller in an optoelectronic device in order to control various operating requirements at different operating temperatures of an optoelectronic device. In one aspect of the invention, the optoelectronic device includes a controller integrated circuitry which includes memory for containing information regarding control parameters for various operating requirements. The optoelectronic device references and uses these control parameters to control operating requirements at various operating temperatures. Exemplary embodiments are described with reference to a transceiver, although it is understood that the systems and methods of the invention may extend to any optoelectronic device.

In one aspect of the invention, the control parameters are determined according to the following method. First, the optoelectronic transceiver is situated in a temperature control chamber. A test controller or host computer is coupled to the optoelectronic transceiver. An electrical test signal is provided to the transmitter-portion of the optoelectronic transceiver, while the signal transmitted from the optical portion of the optoelectronic transceiver is received by an optical signal analyzer which is coupled to the host computer.

The optical power level and "extinction ratio" of the optoelectronic transceiver are set to a predetermined level corresponding to efficient operation of the optoelectronic transceiver. The temperature of the temperature control chamber is set to a first predetermined temperature, preferably room temperature, and a control parameter (e.g., AC bias, DC bias, and the like.) is adjusted to satisfy an operating requirement (e.g., jitter minimization). The temperature control chamber is set to at least a second predetermined temperature, preferably near the upper end of the operating range of the optoelectronic transceiver, and the above process is repeated.

The adjusted control parameter values at the predefined temperatures are then used to calculate a table of interpolated control parameter values throughout a multitude of intermediate temperatures within the range of operating temperatures for the optoelectronic transceiver. These calculated control parameter values are then stored in the transceiver's memory to be accessed during operation of the transceiver when the transceiver reaches the specific predefined temperatures within the transceiver's temperature operating range.

In another aspect of the invention, multiple control parameters are adjusted to satisfy at least one operating requirement. In yet another aspect of the invention, multiple devices are tested simultaneously, the plurality of devices being evaluated at a first temperature before setting the temperature control chamber to another temperature.

These and other aspects of exemplary embodiments of the present invention will become more fully apparent from the following description and appended claims.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings, in which.

DETAILED DESCRIPTION OF EXEMPLARY EMBODIMENTS

Preferred embodiments of the invention are described below. In the interest of clarity, not all features of an actual implementation are described. It will be appreciated that in the development of any such embodiment, numerous implementation-specific decisions must be made to achieve the designers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Furthermore, while exemplary embodiments describe a transceiver, it is appreciated that the present invention extends to any optoelectronic device including, but not limited to, transceivers, transponders, transmitters and receivers.

Figure 1:
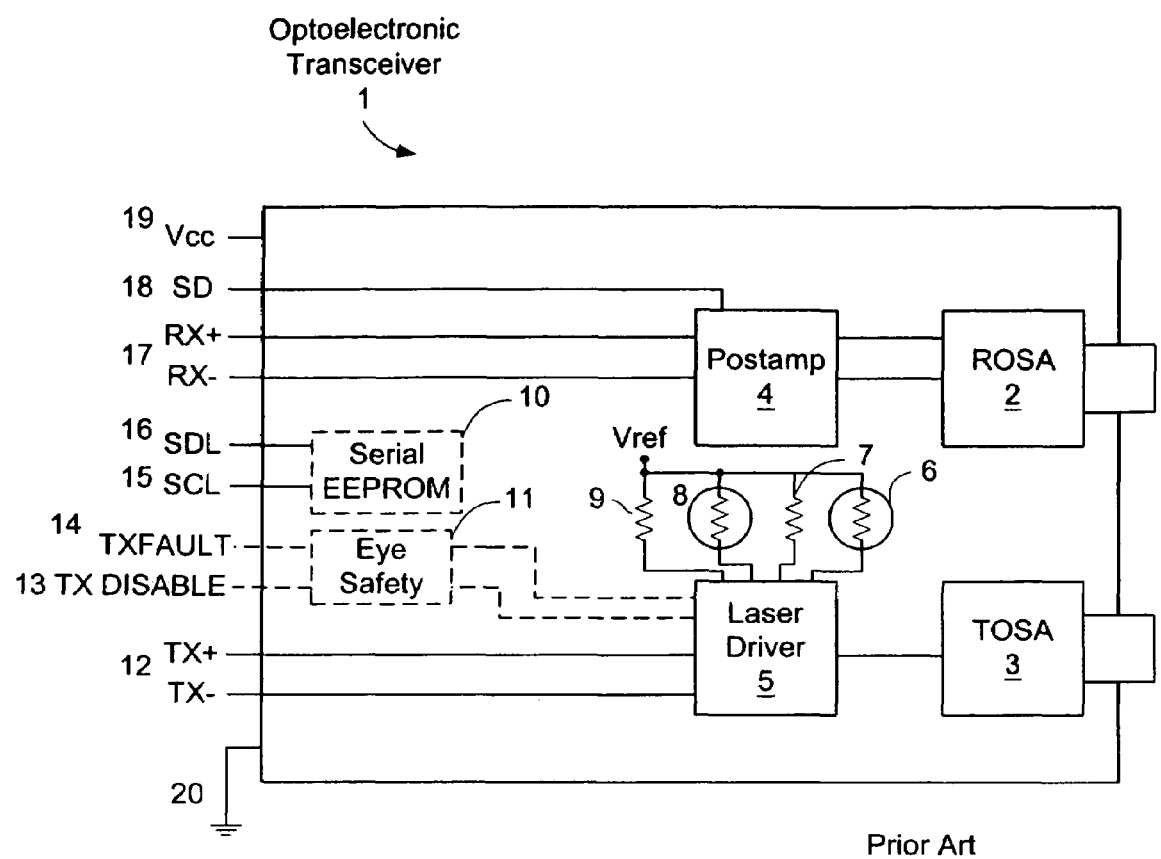
FIG. 1 illustrates a block diagram of a prior art optoelectronic transceiver.
Figure 2:
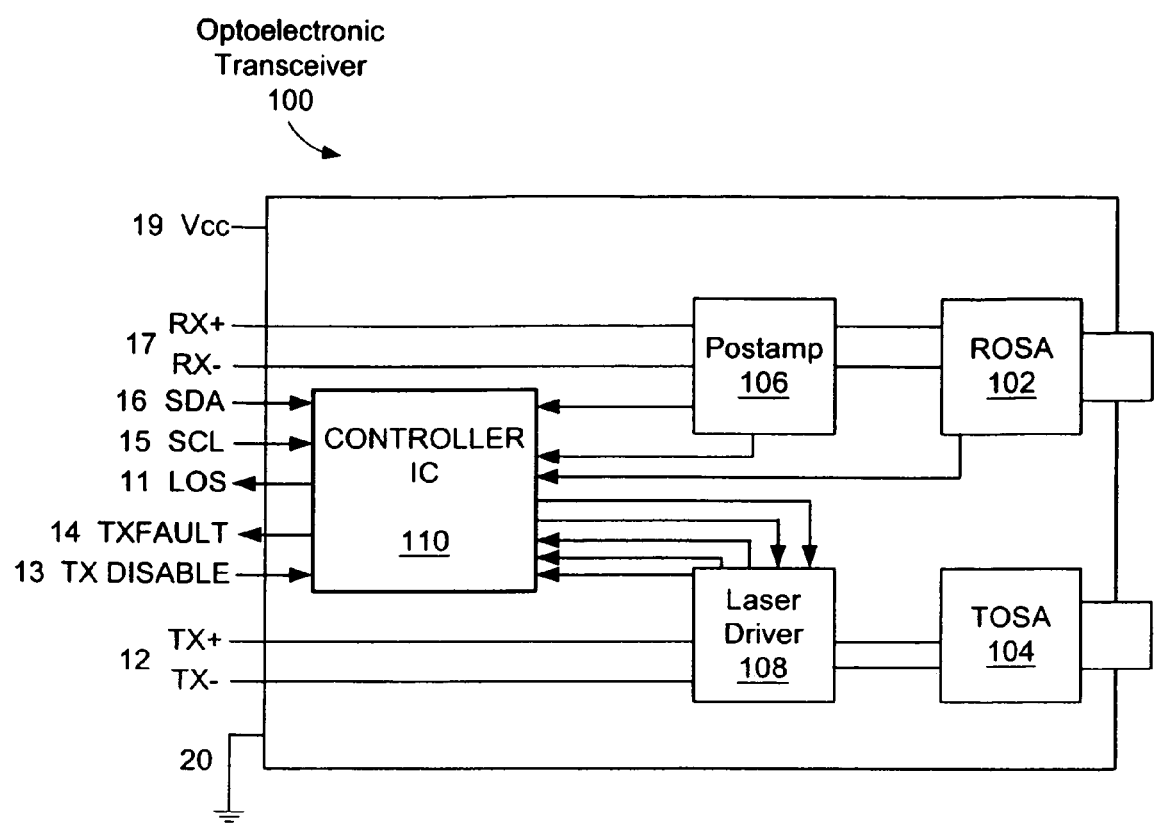
FIG. 2 is a block diagram of an optoelectronic transceiver in accordance with an embodiment of the present invention.
Figure 3:
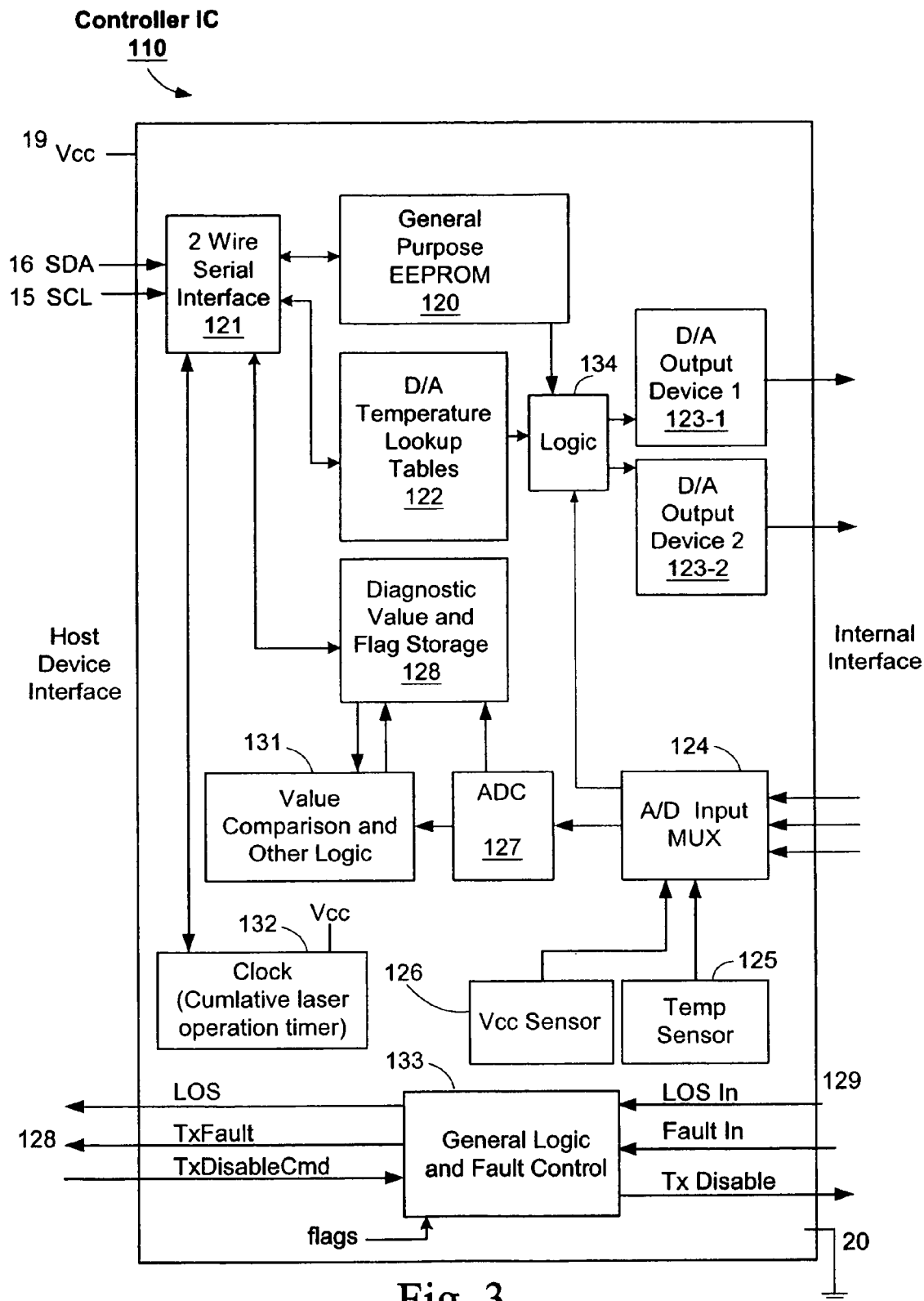
FIG. 3 is a block diagram of modules within the controller IC of the optoelectronic transceiver of FIG. 2.

An exemplary optoelectronic transceiver 100 incorporating features of the present invention is shown in FIGS. 2 and 3. The transceiver 100 contains a receiver circuit, a transmitter circuit, a power supply voltage 19 and ground connections 20. The receiver circuit of the transceiver includes a Receiver Optical Subassembly, (ROSA) 102, which may contain a mechanical fiber receptacle as well as a photodiode and pre-amplifier (preamp) circuit. The ROSA 102 is in turn connected to a post-amplifier (postamp) integrated circuit 106, the function of which is to generate a fixed output swing digital signal which is connected to outside circuitry via the RX+ and RX− pins 17. The postamp circuit 106 also often provides a digital output signal known as Signal Detect or Loss of Signal indicating the presence or absence of suitably strong optical input. The postamp circuit 106 does not necessarily have to be used to generate the Signal Detect or Loss of signal. In alternative embodiments, the postamp circuit 106 could be replaced with a CDR [what does this stand for?] or a demux chip, which embodiments are not shown.

The transmit circuit of the transceiver includes a Transmitter Optical Subassembly (TOSA) 104 and a laser driver integrated circuit 108. The TOSA 104 contains a transmitter, generally a laser diode or LED, and may also include a mechanical fiber receptacle. As an alternative to mechanical fiber receptacles, some transceivers use fiber optic pigtails, which are standard, male fiber optic connectors. A laser driver circuit 108 provides AC drive and DC bias current to the laser diode or LED in the TOSA 104. The signal inputs for the laser driver 108 are obtained from the TX+ and TX− pins 12.

In addition to the basic functions described above, some transceiver platform standards involve additional functionality. Examples of this are the transmitter disable (TX disable) pin 13 and transmitter fault (TX fault) pin 14 described in the GBIC standard, as well as other optoelectronic transceiver standards. In these transceiver standards, the TX disable pin 13 allows the transmitter to be shut off by the host device, while the TX fault pin 14 is an indicator to the host device of some fault condition existing in the laser or associated laser driver circuit. In addition, these standards define how these controls function and interact with each other to implement reset operations and other actions.

Some of this functionality is aimed at preventing non-eyesafe emission levels when a fault condition exists in the laser circuit. These functions may be integrated into the laser driver circuit 108 itself or in a controller integrated circuit 110. Finally, many of the optoelectronic transceiver standards also require that a memory device in the transceiver 100 store standardized serial ID information that can be read out via a serial interface (defined as using the serial interface of the ATMEL AT24C01A family of EEPROM products) having a clock line (SCL) 15 and a data line (SDA) 16.

Control and setup functions of the transceiver 100 are implemented with the controller IC 110, which in one embodiment is implemented as a single-chip integrated circuit. The controller IC 110 handles all low speed communications with a host device. These include the standardized pin functions such as Loss of Signal (LOS) 11, TX fault pin 14, and the TX disable pin 13.

All the components of the transceiver 100 are preferably located in a protective housing except for connectors that may protrude from the housing. Suitable housings, including metallic, plastic, potting box and other housing structures are well known in the art.

With reference to FIG. 3, the controller IC 110 is shown in further detail. Controller IC 110 has a two-wire serial interface 121, also called the memory interface, for reading, and writing to memory mapped locations in the controller IC. The interface 121 is coupled to host device interface input/output lines, typically clock (SCL) and data (SDA) lines, 15 and 16. In one embodiment, the serial interface 121 operates in accordance with the two wire serial interface standard that is also used in the GBIC and SFP standards. Other interfaces could be used in alternate embodiments.

The two wire serial interface 121 is used for all setup and querying of the controller IC 110, and enables access to the optoelectronic transceiver's control circuitry as a memory mapped device. That is, tables and parameters are set up by writing values to predefined memory locations of one or more memory devices 120, 122, 128 (e.g., EEPROM devices) in the controller, whereas diagnostic and other output and status values are output by reading predetermined memory locations of the same memory devices 120, 122, 128. At least some of these memory devices are nonvolatile memory devices that retain the values stored in them even when electrical power is not provided to the transceiver 100. The serial interface 121 is consistent with currently defined serial ID functionality of many transceivers where a two wire serial interface is used to read out identification and capability data stored in an EEPROM. As shown in FIG. 3, the controller IC 110 includes a General Purpose EEPROM 120, a temperature lookup table 122, and a diagnostic value and flag storage 128.

It is noted here that some of the memory locations in the memory devices 120, 122, 128 are dual ported, or even triple ported in some instances. That is, while these memory mapped locations can be read and in some cases written via the serial interface 121, they are also directly accessed by other circuitry components in the controller IC 110. For instance, certain "margining" values stored in memory 120 are read and used directly by logic 134 to adjust (i.e., scale upwards or downwards) drive level signals being sent to the digital to analog output devices 123. Similarly, there are flags stored in memory 128 that are (A) written by logic circuit 131, and (B) read directly by logic circuit 133. An example of a memory mapped location not in the memory devices but that is effectively dual ported is the output or result register of clock 132. In this case the accumulated time value in the register is readable via the serial interface 121, but is written by circuitry in the clock circuit 132.

In addition to the result register of the clock 132, other memory mapped locations in the controller IC 110 may be implemented as registers at the input or output of respective sub-circuits of the controller. For instance, the margining values used to control the operation of logic 134 may be stored in registers in or near logic 134 instead of being stored within memory device 128.

As shown in FIGS. 2 and 3, the controller IC 110 has connections to the laser driver 108 and receiver components. These connections serve multiple functions. The controller IC 110 has a multiplicity of digital to analog converters 123. In one embodiment the digital to analog converters are implemented as current sources, but in other embodiments the digital to analog converters may be implemented using voltage sources. In yet other embodiments, the digital to analog converters may be implemented using digital potentiometers. In some embodiments, the output signals of the digital to analog converters are used to control key parameters of the laser driver circuit 108. In particular, outputs of the digital to analog converters 123 are used to control the DC bias current as well as the AC modulation level of the electrical signal applied by the laser driver circuit 108 to the laser or LED in TOSA 104.

In some embodiments, the controller IC 110 includes mechanisms to compensate for temperature dependent characteristics of the laser in TOSA 104. This is implemented in the controller IC 110 through the use of temperature lookup tables 122 that are used to assign values to the control outputs of the controller IC 110 as a function of the temperature measured by a temperature sensor 125 within the controller IC 110 and/or the temperature measured by a temperature sensor in or near the TOSA 104. The controller IC 1110 also receives a temperature input signal from a temperature sensor 125. The temperature sensor may be incorporated into the controller IC 110 or may be a separate device within the transceiver housing.

In particular, a current temperature value is obtained from a temperature sensor either in the controller IC 110 (e.g., sensor 125) or in or near the TOSA 104. That temperature value is converted into a digital value (by analog to digital converter (ADC) 127), and rounded or otherwise processed if necessary to form an index value for indexing into the temperature lookup tables 122. The index value is then used to lookup or access control parameter (e.g., AC bias, DC bias and APD bias) settings in the memory 122 (temperature lookup tables) corresponding to the current temperature in the transceiver. These control parameter settings are converted into analog signals by a set of digital to analog converters 123, and the resulting analog signals are used to control the operation of the laser driver 108, which, in turn, controls the laser diode or LED in the TOSA 104.

In one embodiment, the outputs of digital to analog converters 123 are current signals. In other embodiments, the controller IC 110 may use digital to analog converters with voltage source outputs or may even replace one or more of the digital to analog converters 123 with digital potentiometers to control the characteristics of the laser driver 108 in accordance with the control parameter settings obtained from the lookup tables in memory 122. It should also be noted that while FIG. 2 shows a system where the laser driver 108 is specifically designed to accept inputs from the controller IC 110, it is possible to use the controller IC 110 with many other laser drivers to control their output characteristics.

FIG. 2 shows a number of connections to and from the laser driver 108 and the controller IC 110. In addition, controller IC 110 has connections to and from the ROSA 102 and Postamp 106. These are analog monitoring connections that the controller IC 110 uses to provide diagnostic feedback to the host device via memory mapped locations in the controller IC 110.

With reference to FIG. 3, in one embodiment, the controller IC 110 has a multiplicity of analog inputs. The analog input signals indicate operating conditions of the transceiver and/or receiver circuitry. These analog signals are scanned by a multiplexer ("mux") 124 and converted using an analog to digital converter ("ADC") 127. In one embodiment, the ADC 127 has 12 bit resolution; although ADC's with other resolution levels may be used. The converted values are stored in predefined memory locations, for instance in the diagnostic value and flag storage device 128 shown in FIG. 3, and are accessible to the host device via memory reads. These values are calibrated to standard units (such as millivolts or microwatts) as part of a factory calibration procedure.

Figure 4:
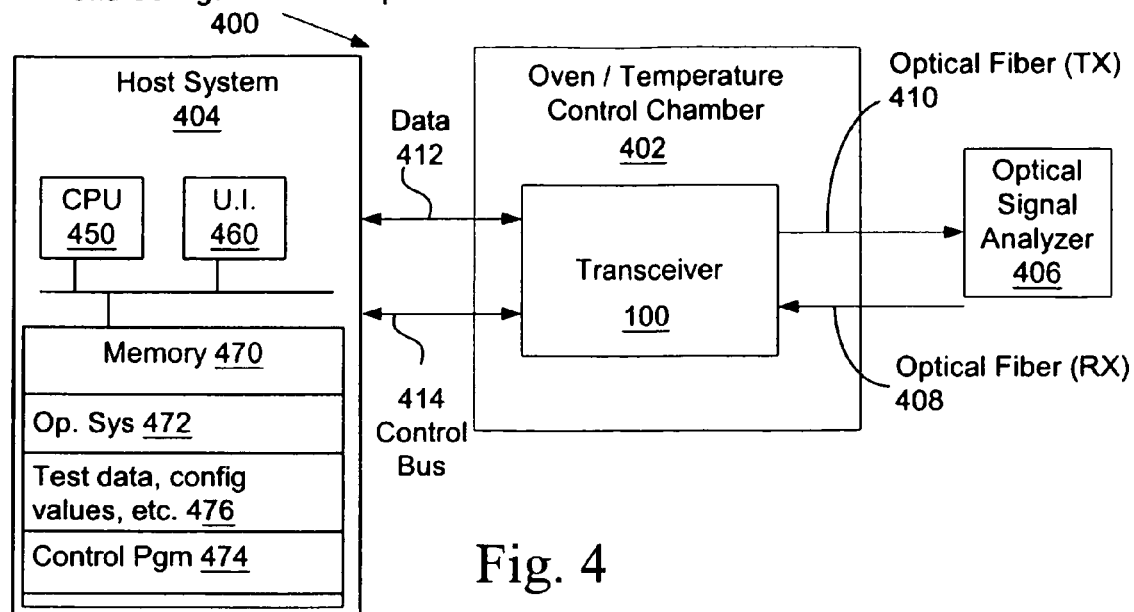
FIG. 4 is a block diagram of a system for testing and configuring an optoelectronic transceiver in accordance with an embodiment of the present invention.

FIG. 4 is a block diagram of a system for testing and configuring an optoelectronic transceiver. The optoelectronic transceiver testing and configuration system 400 includes an optoelectronic transceiver 100 situated in an oven or temperature control chamber 402. In another embodiment, the optoelectronic transceiver 100 may be associated with a thermoelectric cooler which can be configured to increase or decrease the temperature of the optoelectronic device. A test controller or host computer 404 is coupled to the optoelectronic transceiver 100. Similarly, multiple optoelectronic transceivers 100 may be simultaneously tested and configured by adjusting the described connections and set-up to accommodate multiple transceivers.

A test signal is provided to the receiver portion of the optoelectronic transceiver through an optical fiber (RX) 408, while the signal transmitted from the optoelectronic transceiver through optical fiber (TX) 410 is received by an optical signal analyzer 406 (e.g., a digital communication analyzer) which is coupled to the host computer 404.

The host computer 404 preferably contains a user interface 460, one or more interfaces (not shown) for connection to the temperature control chamber, a central processing unit ("CPU") 450 and a memory 470. The memory 470 may include high speed random access memory and may also include nonvolatile mass storage, such as one or more magnetic disk storage devices. The memory may include mass storage that is remotely located from the central processing unit(s).

The memory 470 preferably stores an operating system 472, control parameter setup procedures 474, operational requirement settings (e.g., jitter minimization) and temperature compensation values 476. The memory 470 may also include "extinction ratio" and optical power level setup procedures. The operating system 472 stores instructions for communicating, processing data, accessing data, storing data, searching data, etc. The control parameter setup procedures 474 are a set of instructions that test and configure the transceiver 100, described with respect to FIG. 10. Temperature compensation values are recorded in the memory for use in computing temperature compensation and jitter minimization values at predefined temperatures, (see FIG. 10).

The host computer 404 controls the function of the temperature control chamber 402 and the transceiver 100 being tested and configured. The host computer 404 is coupled to the transceiver 100 via a data bus 412, for transmitting and receiving test data patterns, and a control bus 414 that transmits control parameters (including computed temperature compensation values to be stored in the transceiver's 100 temperature look-up tables 122) from the host computer 404 to the transceiver 100, and transmits monitoring data from the transceiver 100 to the host computer 404.

The host computer 404 processes and records the settings and measurements made during the optoelectronic transceiver testing and configuration process. These settings and measurements preferably include the optical power level, "extinction ratio," jitter, temperature, APD bias level and DC and AC bias levels.

The optical signal analyzer 406 receives the optical test output signal via optical fiber (TX) 410 from the transceiver 100 and analyzes the test signal for compliance with pre-programmed operating requirements such as jitter minimization. The optical signal analyzer 406 is coupled to the host computer 404 and transmits the results of its analysis to the host computer 404 for further adjustment of the control parameters if necessary.

In another embodiment, analysis of the test signal for compliance with operating requirements can be done manually by viewing a scope, such as a digital communication analyzer ("DCA"), that displays the test signal. Necessary adjustments to control parameters are then communicated to the host computer 404 by the viewer until operating requirement compliance is achieved. In embodiments where there are multiple transceivers 100 in the temperature control chamber 402, the host computer 404 is selectively coupled to each of the transceivers 100 in the temperature control chamber 402 while the chamber is held at each calibration temperature, enabling the host computer 404 to test and calibrate each of the transceivers at that calibration temperature.

Figure 5:
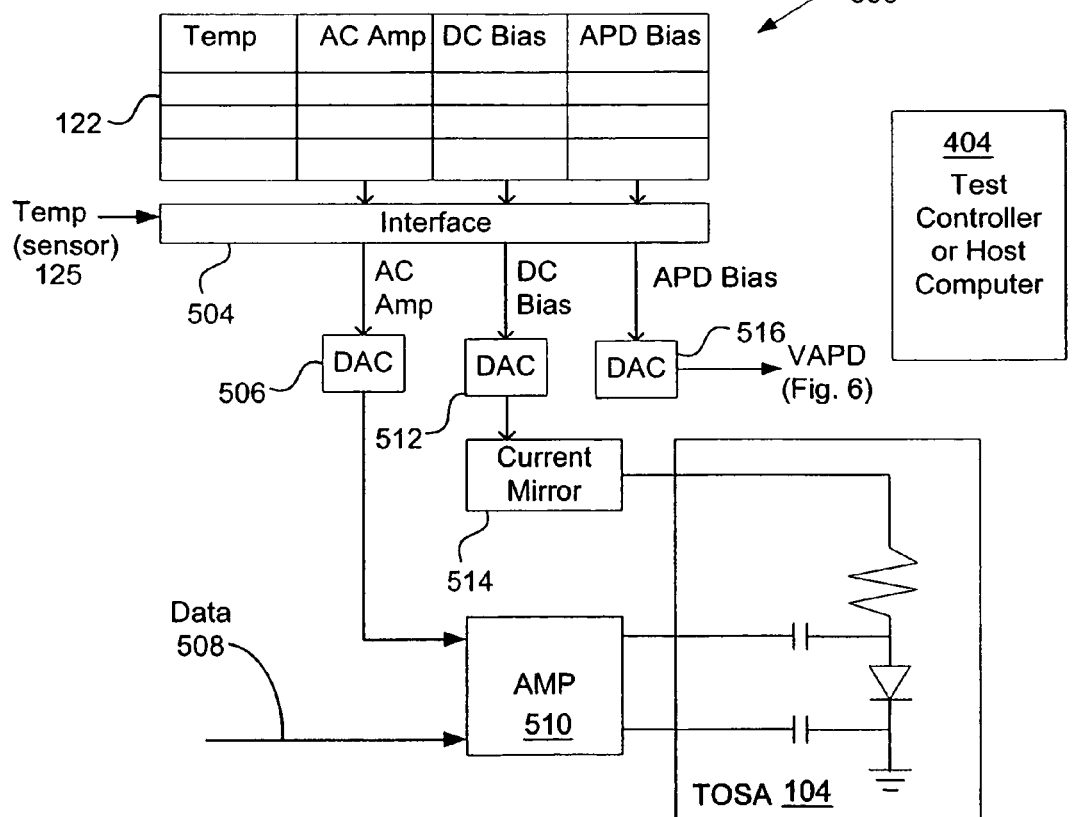
FIG. 5 is a conceptual representation of temperature compensation as performed during operation of an optoelectronic transceiver in accordance with an embodiment of the present invention.

FIG. 5 is a conceptual representation of the temperature compensation function of the controller IC 110 during operation of an optoelectronic transceiver 100. As the temperature changes during the operation of the optoelectronic transceiver 100, the temperature sensor 125 (see FIG. 3) senses the temperature change and the corresponding control parameter values are sent from the temperature lookup table 122 (see FIG. 3) to the interface 504. The control parameters preferably include the AC amplitude and the DC bias, and may include the APD (avalanche photo diode) bias, which is a voltage.

The interface 504 sends the appropriate digital AC amplitude value to a DAC (digital to analog converter) 506 and the resulting analog signal is conveyed, along with the data signal 508, to an amplifier 510. The data signal, as amplified by the amplifier 510 is sent to the TOSA 104.

Similarly, the interface 504 sends the appropriate digital DC bias value to a DAC 512 and the resulting analog signal is scaled at some predetermined ratio by a current mirror 514 before it is provided to the TOSA 104. This DC bias signal controls the average optical power (see FIG. 6) output by the TOSA 104. In addition to performing a scaling function, the current mirror 514 performs an isolating function to prevent interference with the components and processes located elsewhere in the operational set-up explained above.

Figure 7:
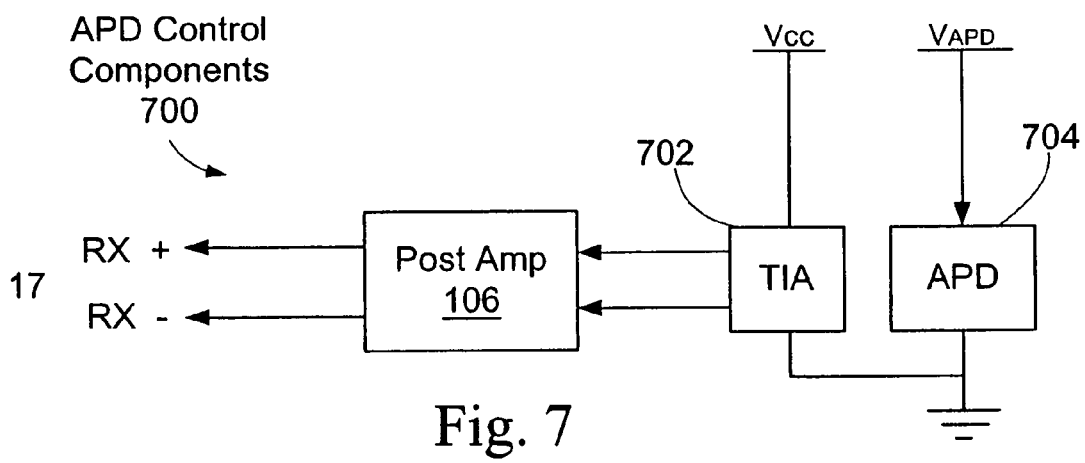
FIG. 7 is a block diagram of an avalanche photodiode and its support circuitry in accordance with an embodiment of the present invention.

The interface 504 also sends the appropriate digital APD bias voltage value to a DAC 516 and the resulting analog signal is sent as a voltage source $V_{APD}$ to the avalanche photodiode 704 shown in FIG. 7.

Figure 6:
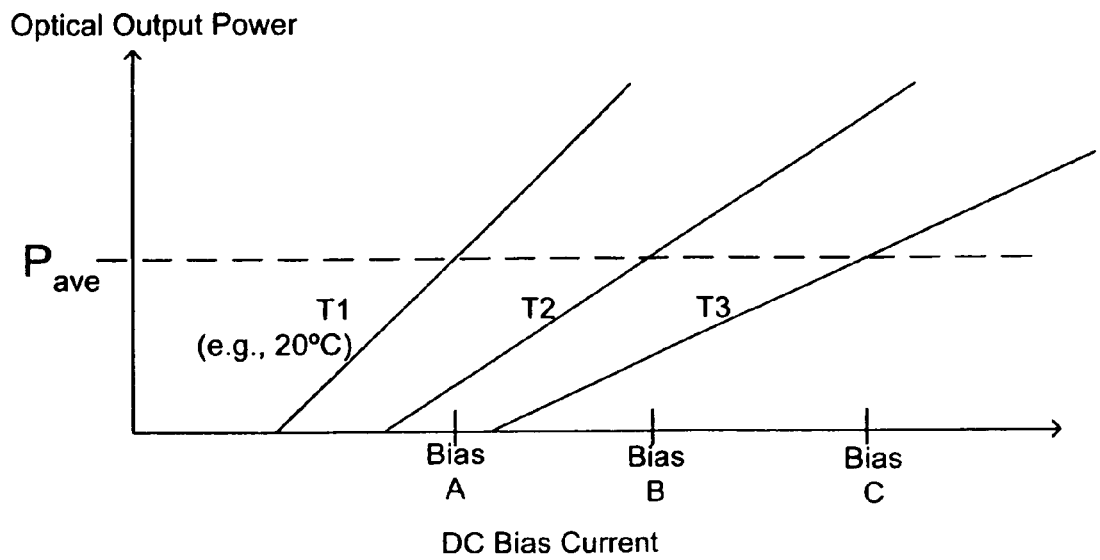
FIG. 6 is a conceptual representation of the relationship of DC Bias Current to Optical Output Power at various temperatures for the optoelectronic transceiver of FIG. 2.

FIG. 6 is a conceptual representation of the relationship of DC Bias Current to Optical Output Power at various temperatures for the optoelectronic transceiver 100. The lines, T1, T2 and T3, represent the optical output power at various temperatures as a function of the DC bias. The point where the desired average optical power Pave intersects with the temperature lines T1, T2 and T3 is the preferred DC bias setting Bias A, Bias B and Bias C, respectively. Interpolation is used to calculate the preferred DC bias settings, or control parameters, at predetermined temperatures between the temperatures T1, T2 and T3 with known preferred DC bias values.

FIG. 7 is a block diagram of one embodiment of an avalanche photodiode and its support circuitry. These components are all located within the transceiver housing. A reverse-bias voltage $V_{APD}$ originating from the temperature lookup table 122 and based on the relevant temperature is applied to an avalanche photodiode 704.

As is well known in the art, if the reverse-bias voltage applied to an avalanche photodiode is increased, an avalanche breakdown will eventually occur at a characteristic avalanche voltage $V_A$. The avalanche voltage $V_A$ is typically in a range between 40 volts and 70 volts at room temperature; however it varies from one device to another and also varies as a (generally increasing) function of the temperature of the avalanche photodiode. The sensitivity of an avalanche photodiode is maximized when it is operated at a reverse-bias voltage $V_{APD}$ that is less than the avalanche voltage $V_A$ by an offset voltage that is relatively small (approximately 1 volt for some avalanche photodiodes). It is in this way that the controller IC 110 in conjunction with the values stored in the temperature lookup tables 122 are used to regulate the reverse-bias voltage $V_{APD}$ applied to an avalanche photodiode so that the maximum sensitivity of the avalanche photo diode is maintained over a range of temperatures.

The output signal from the avalanche photo diode 704 is amplified by a transimpedance amplifier (TIA) 702 and then amplified by a post-amplifier (postamp) integrated circuit 106, a CDR (not shown) or a demux chip (not shown). The postamp 106 generates a fixed output swing digital signal which is connected to outside circuitry via the RX+ and RX− pins 17.

Figure 8:
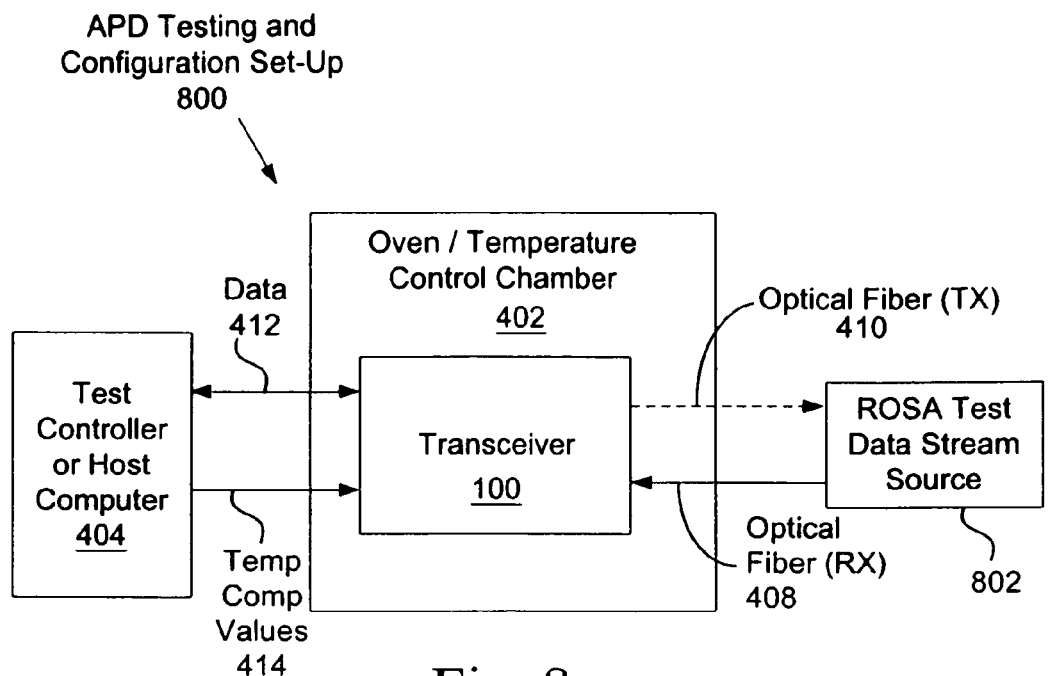
FIG. 8 is a block diagram of a system for testing and configuring an avalanche photodiode in accordance with an embodiment of the present invention.

FIG. 8 is a block diagram of a system for testing and configuring an avalanche photodiode ("APD"). The APD testing and configuration system 800, which is the test set-up for working with the APD control components 700 set-up shown in FIG. 7, includes an optoelectronic transceiver 100 situated in an oven or temperature control chamber 402. A test controller or host computer 404 is coupled to the optoelectronic transceiver 100. The host computer 404 and its connections to the temperature control chamber 402 and transceiver 100 are described above with reference to FIG. 4.

An optical signal is preferably applied to the transceiver 100 in order to perform tests and configurations based on application and related assumptions. A ROSA test data stream source 802 feeds a test signal to the receiver portion of the optoelectronic transceiver 100 through an optical fiber (RX) 408. In an optional configuration, the signal transmitted from the optoelectronic transceiver 100 through optical fiber (TX) 410 is received by the ROSA test data stream source 802.

Figure 9:
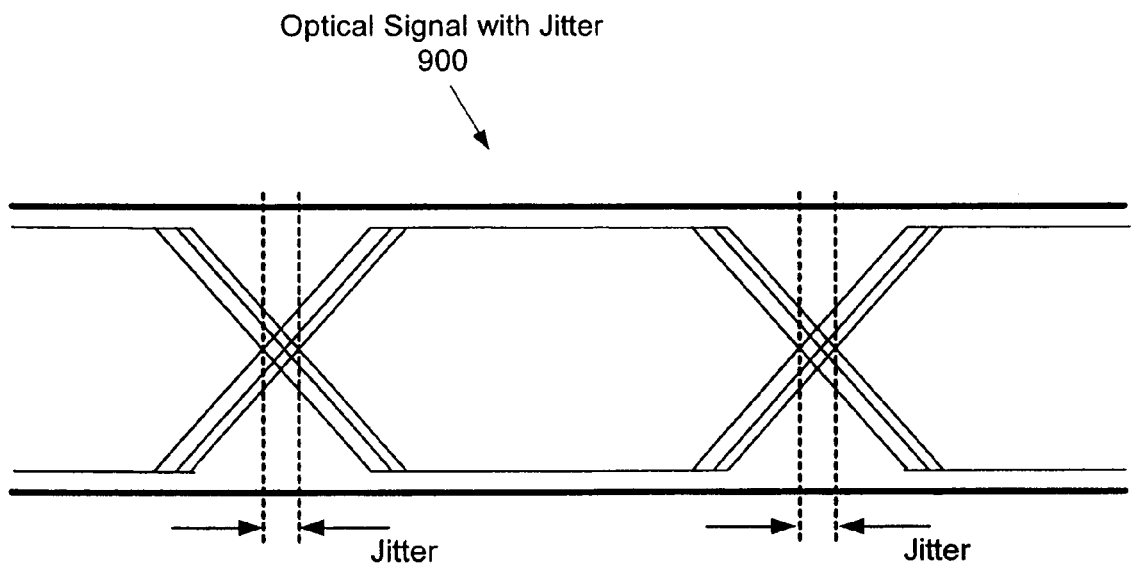
FIG. 9 is a representation of an optical signal with jitter as seen by an optical signal analyzer.

FIG. 9 is a representation of an optical signal with jitter as seen by an optical signal analyzer. The minimization of jitter improves signal clarity and intensity. Jitter is the width of the "50% line" as represented in FIG. 9. The control parameters are adjusted during the testing and configuration phase of the optoelectronic transceiver 100 to reduce the jitter width, thereby improving the quality of the outgoing signal.

Figure 10:
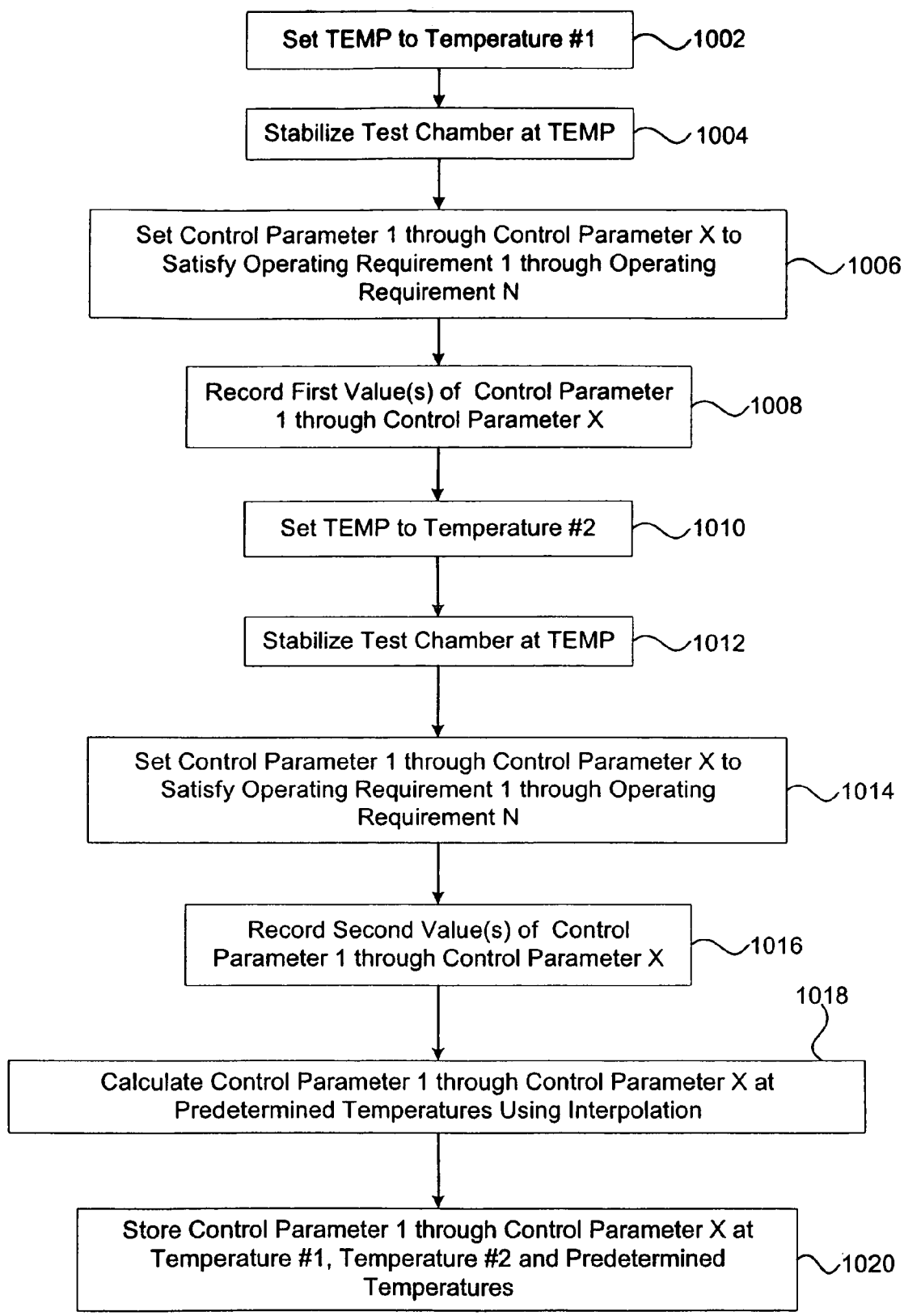
FIG. 10 is a flow-chart of a method for calibrating an optoelectronic transceiver in accordance with an embodiment of the present invention.

FIG. 10 is a flow-chart of a method for calibrating an optoelectronic transceiver 100. The optical power level and "extinction ratio" of the optoelectronic transceiver 100 are set to a predetermined level corresponding to efficient operation of the optoelectronic transceiver and the specifications in the data sheet. Once the transceiver 100 is placed in the temperature control chamber 402, or similar temperature controlled environment, at step 1002, the temperature control chamber 402 is set to a first temperature at one end of the temperature calibration range, preferably room temperature. The temperature calibration range is preferably similar to or greater than the operating range of the optoelectronic transceiver 100. At step 1004, the temperature control chamber 402 is stabilized at the first temperature.

At step 1006, the desired control parameters (e.g., AC bias, DC bias, etc.) are set at the first temperature to satisfy an operating requirement (e.g., jitter minimization). Alternatively, multiple control parameters can be adjusted to satisfy multiple operation requirements at the first temperature. At step 1008, the values of the control parameters are recorded at an entry (e.g., in a table in memory) for the first temperature for use in later calculations.

At step 1010, the temperature control chamber 402 is then set to at least a second temperature within the temperature calibration range. If calibration is being performed at just two temperatures, the second temperature is preferably near the upper end of the operating range of the optoelectronic transceiver 100; otherwise the second temperature is preferably a second temperature in a predefined sequence of calibration temperatures. At step 1012, the temperature control chamber 402 is stabilized at this second temperature. At step 1014, the control parameters are adjusted as necessary to satisfy one or more operating requirements. At step 1016, the values of the control parameters are then recorded in the memory of the host computer 404 for use in later calculations. The process of setting a predetermined temperature, adjusting one or more control parameters to meet one or more operating requirements, and storing the results may be repeated at multiple calibration temperatures.

At step 1018, the recorded control parameter values at the predefined temperatures are then used to calculate (e.g., using linear interpolation) a table of interpolated control parameter values corresponding to each operating requirement throughout a multitude of predefined intermediate temperatures within the range of operating temperatures for the optoelectronic transceiver 100. At step 1020, these control parameter tables are then stored in the temperature look-up tables 122 of the transceiver 100 to be accessed during operation of the transceiver when it reaches the specific predefined temperatures within the transceiver's temperature operating range.

In embodiments in which multiple transceivers are tested and calibrated simultaneously, certain steps of the procedures represented by FIG. 10 are repeated for each respective transceiver in the test chamber. In particular, steps 1006, 1008, 1014 and 1016 are each repeated for every respective transceiver in the test chamber before the calibration procedure moves onto the next step. Similarly, interpolation and storage steps 1018 and 1020 are performed for each respective transceiver.

Examples of operating requirements that are effected by control parameters include jitter minimization, optical output power, extinction ratio, crossing percentage, mask hits, mask margin, avalanche photodiode temperature compensation, and the like.

Some aspects of the present invention can be implemented as a computer program product that includes a computer program mechanism embedded in a computer readable storage medium. For instance, the computer program product could contain the program modules for embodiments discussed regarding FIGS. 4, 8 and 10. These program modules may be stored on a CD-ROM, magnetic disk storage product, or any other computer readable data or program storage product. The software modules in the computer program product may also be distributed electronically, via the Internet or otherwise, by transmission of a computer data signal (in which the software modules are embedded) on a carrier wave.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for calibrating an optoelectronic device, the method comprising:
    at a first temperature, adjusting a control parameter until at least one operating requirement associated with the optoelectronic device is substantially satisfied;
    recording a first value of the control parameter;
    at a second temperature, adjusting the control parameter until at least one operating requirement associated with the optoelectronic device is substantially satisfied;
    recording a second value of the control parameter;
    for one or more temperatures between the first and second temperatures, using the first and second values of the control parameter to determine values of the control parameter that each correspond, respectively, to a temperature; and
    storing the values of the control parameter in the optoelectronic device, each value being associated with a corresponding temperature.

2. The method as recited in claim 1, wherein the first temperature is proximate a lower boundary of an operational temperature range, and the second temperature is proximate an upper boundary of the operational temperature range.

3. The method as recited in claim 1, wherein the at least one operating requirement comprises one or more of a jitter requirement; an optical output power requirement; an extinction ratio requirement; a crossing percentage requirement; a mask hit requirement; a mask margin requirement; and, an APD temperature compensation requirement.

4. The method as recited in claim 1, wherein, for the one or more temperatures between the first and second temperatures, calculation of the respective values of the control parameter is performed using interpolation.

5. The method as recited in claim 1, wherein the method is performed substantially simultaneously for a plurality of optoelectronic devices.

6. The method as recited in claim 1, wherein the at least one control parameter comprises one or more of: APD bias; AC amplitude; and, DC bias.

7. The method as recited in claim 1, further comprising storing temperature values in the optoelectronic device, each stored temperature value corresponding to: a temperature; and, a control parameter value.

8. A method for operating an optoelectronic device, the method comprising:
    sensing a first temperature associated with the optoelectronic device;
    accessing a control parameter value that is stored in the optoelectronic device and that is associated with a temperature value that corresponds to the first temperature;
    generating at least one control signal based upon the control parameter value, the control signal being associated with a DC bias, and is subjected to a scaling function and an isolating function; and
    using the control signal to adjust performance of a transmitter within the optoelectronic device so that the optoelectronic device substantially meets at least one operating requirement.

9. The method as recited in claim 8, wherein the at least one operating requirement comprises one or more of a jitter requirement; an optical output power requirement; an extinction ratio requirement; a crossing percentage requirement; a mask hit requirement; a mask margin requirement; and, an APD temperature compensation requirement.

10. The method as recited in claim 8, wherein the at least one control signal is an analog signal generated by conversion of the control parameter value.

11. The method as recited in claim 8, wherein the control parameter value is accessed in connection with an index value that comprises a modified version of the temperature value.

12. The method as recited in claim 8, wherein the at least one control signal comprises one or more of a current signal; and, a voltage signal.

13. The method as recited in claim 8, wherein adjustment of performance of a transmitter within the optoelectronic device comprises adjusting one or more of: APD bias; AC amplitude; and, DC bias.

14. The method as recited in claim 8, wherein when the control signal is associated with an AC amplitude, the control signal is amplified.

15. A method for calibrating an optoelectronic device, the method comprising:
    at a first temperature, adjusting a control parameter until at least a jitter requirement associated with the optoelectronic device is substantially satisfied;
    recording a first value of the control parameter;
    at a second temperature, adjusting the control parameter until the jitter requirement associated with the optoelectronic device is substantially satisfied;
    recording a second value of the control parameter;

for one or more temperatures between the first and second temperatures, using the first and second values of the control parameter to determine values of the control parameter that each correspond, respectively, to a temperature; and storing the values of the control parameter in the optoelectronic device, each value being associated with a corresponding temperature.

16. The method as recited in claim 15, wherein the control parameter comprises one of: APD bias; AC amplitude; and, DC bias.

17. The method as recited in claim 15, wherein the first temperature comprises a lower boundary of an operational temperature range, and the second temperature comprises an upper boundary of the operational temperature range.

18. The method as recited in claim 15, wherein adjustment of the control parameter proceeds until one or more of the following requirements, in addition to the jitter requirement, is substantially satisfied: an optical output power requirement; an extinction ratio requirement; a crossing percentage requirement; a mask hit requirement; a mask margin requirement; and, an APD temperature compensation requirement.

19. The method as recited in claim 15, further comprising storing temperature values in the optoelectronic device, each stored temperature value corresponding to: a temperature; and, a control parameter value.

20. A transceiver in which the method of claim 8 is performed.

* * * * *

UNITED STATES PATENT AND TRADEMARK OFFICE
CERTIFICATE OF CORRECTION

PATENT NO. : 7,230,961 B2
APPLICATION NO. : 11/054999
DATED : June 12, 2007
INVENTOR(S) : Hofmeister et al.

Page 1 of 1

It is certified that error appears in the above-identified patent and that said Letters Patent is hereby corrected as shown below:

Title Page
Page 2, Column 2, remove the following reference:
--WO    WO 98/00893    1/1998--

Column 6, in the Specification
Line 55, change "1110" to --110--

Signed and Sealed this

Twenty-fourth Day of August, 2010

David J. Kappos
*Director of the United States Patent and Trademark Office*